United States Patent
Woodall et al.

(10) Patent No.: US 8,988,036 B1
(45) Date of Patent: Mar. 24, 2015

(54) SOLAR PANEL STORAGE AND DEPLOYMENT SYSTEM

(75) Inventors: Robert C. Woodall, Panama City, FL (US); Steven F. Naud, Lynn Haven, FL (US); David H Wilbanks, Panama City Beach, FL (US); Amy N. Satterlee, Lynn Haven, FL (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 447 days.

(21) Appl. No.: 13/441,329

(22) Filed: Apr. 6, 2012

(51) Int. Cl.
*H01M 10/46* (2006.01)
*H01L 31/053* (2014.01)

(52) U.S. Cl.
CPC .................... *H01L 31/053* (2013.01)
USPC ....................................................... 320/101

(58) Field of Classification Search
USPC .......... 320/101, 107, 114, 116; 136/244, 245, 136/291, 292; 414/277, 279, 280, 281, 282; 104/34
See application file for complete search history.

(56) References Cited

U.S. PATENT DOCUMENTS

| | | | | |
|---|---|---|---|---|
| 5,969,501 A * | 10/1999 | Glidden et al. | ............... | 320/101 |
| 6,201,181 B1 * | 3/2001 | Azzam et al. | ................. | 136/244 |
| 7,230,819 B2 * | 6/2007 | Muchow et al. | .............. | 361/601 |
| 7,795,837 B1 * | 9/2010 | Haun et al. | ..................... | 320/101 |
| 2008/0068782 A1 * | 3/2008 | Muchow et al. | .............. | 361/601 |
| 2009/0102415 A1 * | 4/2009 | Muchow et al. | .............. | 320/101 |
| 2011/0277809 A1 * | 11/2011 | Dalland et al. | ................ | 136/244 |
| 2012/0291847 A1 * | 11/2012 | Rowe et al. | ................... | 136/245 |

* cited by examiner

*Primary Examiner* — Edward Tso
(74) *Attorney, Agent, or Firm* — James T. Shepherd

(57) ABSTRACT

A solar panel storage and deployment system includes a container with an opening formed therein. A rotatable spool housed in the container has an assembly of solar voltaic panels wound thereabout prior to its deployment. The assembly is deployed from the opening in the container when the assembly is unwound from the spool. At least one stake is provided where each such stake is anchored to a position in proximity to and outside of the container. Each stake cooperates with a link that couples a free end of the assembly to the stake when the assembly is unwound from the spool and deployed through the opening.

8 Claims, 3 Drawing Sheets

US 8,988,036 B1

SOLAR PANEL STORAGE AND DEPLOYMENT SYSTEM

ORIGIN OF THE INVENTION

The invention described herein may be manufactured and used by or for the Government of the United States of America for Governmental purposes without payment of any royalties thereon or therefore.

FIELD OF THE INVENTION

The invention relates generally to solar panel assemblies, and more particularly to a system that provides for the storage and deployment of solar panels.

BACKGROUND OF THE INVENTION

Many military and civilian operations in remote regions require the generation of on-site electrical power. The cost of deploying fuel for generators and camp lighting can be quite expensive in terms of both fuel cost and the difficulty of delivering such fuel along potentially dangerous routes. In an effort to reduce the number of fuel delivery convoys, alternative energy sources are being explored. Many regions, such as the desert areas of the Middle East, are especially conducive to the use of solar power systems. Unfortunately, existing systems suffer from one or more shortcomings related to functionality and/or efficiency/optimization. Some are cumbersome to set up. Most do not consider array protection during storage and shipment. Still others do not provide for deployment angle adjustability relative to the sun's seasonal orientation to garner maximum power yield.

SUMMARY OF THE INVENTION

Accordingly, it is an object of the present invention to provide a storage and deployment system for solar panels.

Another object of the present invention is to provide a solar panel storage/deployment system readily adapted to become a self-contained power generator.

Still another object of the present invention is to provide a solar panel storage and deployment system easily optimized for seasonal orientations of the sun.

In accordance with the present invention, a solar panel storage and deployment system is provided. A container has an opening formed therein. A rotatable spool is housed in the container. An assembly of solar voltaic panels is wound about the spool prior to its deployment. The assembly has an end coupled to the spool and a free end accessible when the assembly is wound about the spool. The assembly is deployed from the opening in the container when the assembly is unwound from the spool. At least one stake is provided where each such stake is adapted to be anchored to a position in proximity to and outside of the container. Each stake cooperates with a link that couples the free end of the assembly to the stake when the assembly is unwound from the spool and deployed through the opening.

BRIEF DESCRIPTION OF THE DRAWINGS

Other objects, features and advantages of the present invention will become apparent upon reference to the following description of the preferred embodiments and to the drawings, wherein corresponding reference characters indicate corresponding parts throughout the several views of the drawings and wherein.

DETAILED DESCRIPTION OF THE INVENTION

Figure 1:
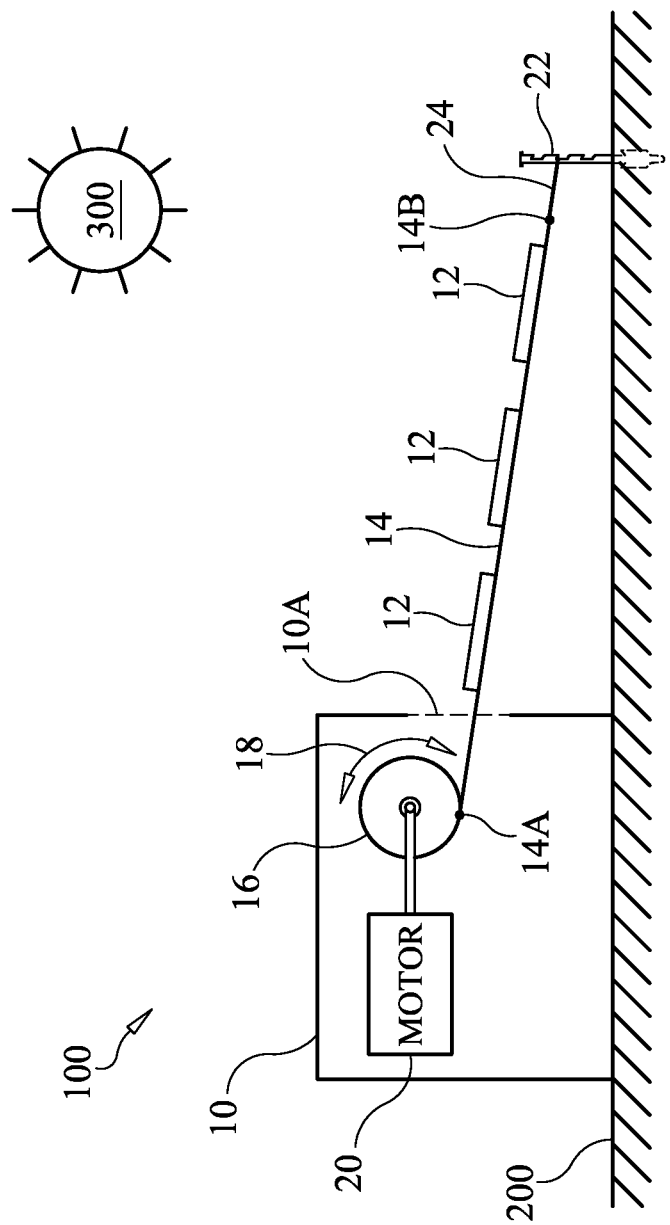
FIG. 1 is a side schematic view of a solar panel storage and deployment system with solar panels in a deployed state in accordance with an embodiment of the present invention.

Referring now to the drawings, and more particularly to FIG. 1, a system for the storage and deployment of a number of solar panels is shown and is referenced generally by numeral 100. System 100 is illustrated in its deployed state at an installation site 200 (e.g., a natural ground location, a man-made platform or pad, etc.) having a clear view of the sun 300. While system 100 could be permanently installed at location 200, a great advantage of the present invention is its ability to provide for the secure/safe storage and shipping of solar panels to installation site 200 followed by the simple deployment of the solar panels into an efficient collector of solar energy. The system also provides for simple/efficient pack-up, transport, and re-deployment if needed. Accordingly the description of system 100 will focus on the features providing these capabilities.

System 100 includes a container 10 that houses the elements of system 100 during the storage, shipping, and deployment thereof. Some of these elements in conjunction with container 10 also provide support for one side of a solar panel assembly as will be described later herein. Container 10 can be a standardized container (e.g., an ISO container) or a specially designed container without departing from the scope of the present invention. Container 10 will typically be of rigid construction.

As used herein, the term "solar panel" refers to a flexible solar voltaic panel that, when exposed to solar energy, generates DC power. One commercial source for such flexible solar voltaic panels is Xunlight Corporation, Toledo, Ohio. The term "solar panel assembly" as used herein refers to a plurality of such flexible solar voltaic panels configured such that the entire assembly is flexible. For example, FIG. 1 illustrates a number of solar panels 12 mounted/coupled to a flexible substrate 14 where the construction of panels 12 and substrate 14 forms a solar panel assembly for purposes of the present invention. The number of solar panels used in such an assembly is not a limitation of the present invention. Flexible substrate 14 can be any material that can support panels 12 and withstand the rigors of an operational environment. For example, flexible substrate 14 could be a tensile fabric such as fabrics made from commercially-available fibers such as KEVLAR or SPECTRA fibers.

Since panels 12 and substrate 14 are flexible, their combination as a solar panel assembly is also flexible where such flexibility facilitates the assembly's storage and deployment. More specifically, a spool 16 is housed/mounted in container 10 for rotation in two directions about its central axis (as indicated by two-headed arrow 18). Rotation 18 can be induced by manual rotation of spool 16. In this case, spool 16 can be torsionally biased to facilitate retraction of the solar panel assembly when it is being re-packed. Still another option is to provide a motor 20 in container 10 that is operationally coupled to spool 16 to induce rotation 18. In all cases, rotation 18 is used to wind panels 12 and substrate 14 onto spool 16 during the packing thereof, or deploy panels 12 and substrate 14 from spool 16 for the deployed state of the assembly shown in FIG. 1. Deployment and retraction of the assembly from and into container 10 is made via an opening 10A formed in container 10 where opening 10A can be sealable.

One end 14A of flexible substrate 14 is fixed to spool 16 to thereby support one end of the assembly formed by panels 12 and substrate 14 when the assembly is in its deployed state. The opposing end 14B of flexible substrate 14 is free when the assembly is wound on spool 16. However, when the assembly is deployed as shown, end 14B is coupled to a stake 22 by a link 24. Stake 22 is any rigid support that can be fixed at a point outside of container 10 at installation site 200. Link 24 can be integrated with substrate 14 or stake 22, or can be attachable thereto without departing from the scope of the present invention. In general, stake 22 and link 24 cooperate to place substrate 14 in tension to thereby define a planar support for panels 12. Further, stake 22 and link 24 cooperate to set the angle (relative to sun 300) of the planar support provided by substrate 14 to thereby set the angle of panels 12 with respect to sun 300. In this way, the present invention can optimize the angular orientation of panels 12 relative to the seasonal orientation of sun 300. Link 24 can be adjustable in length (e.g., a ratchet strap) and/or made from an elastic material (e.g., elastic band, bungee cord, etc.) to provide the requisite amount of tension in flexible substrate 14 in order to maintain a substantially planar orientation of substrate 14 for the deployed state of the solar panel assembly.

Figure 2:
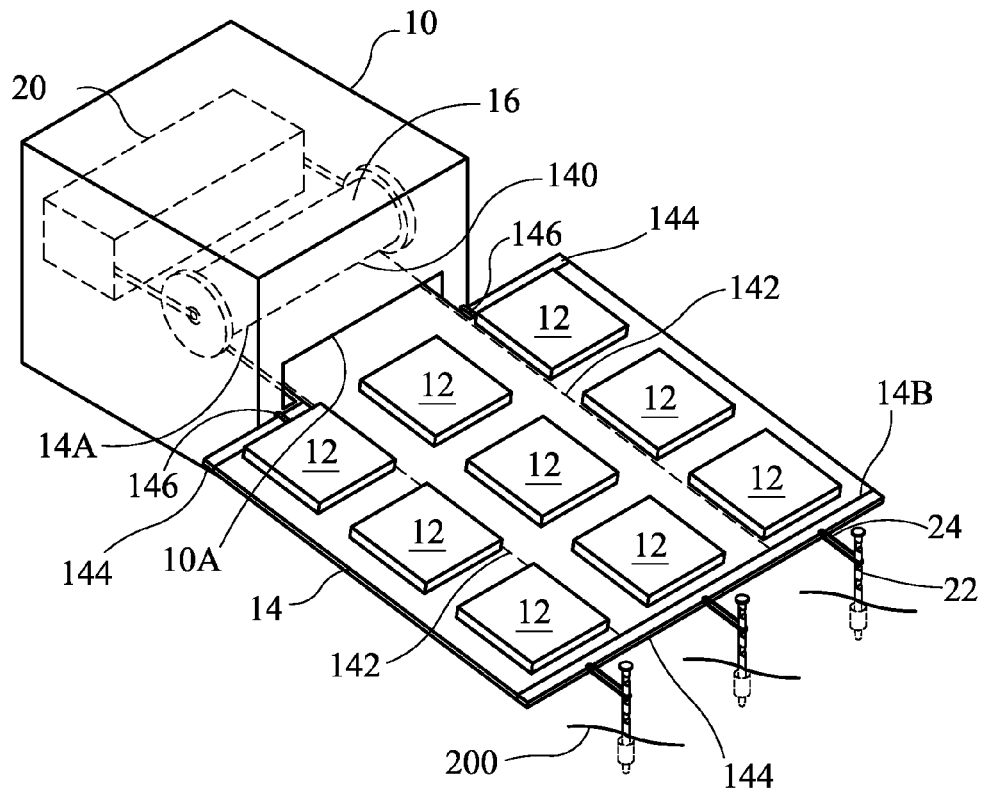
FIG. 2 is a perspective view of the solar panel storage and deployment system illustrated in FIG. 1.

FIG. 2 illustrates an embodiment of system 100 that provides for the deployment of a greater number of solar panels 12 for a given width of spool 16. In general, this is achieved by a substrate 14 that is wider than spool 16 such that substrate 14 can be folded to a width that can be accommodated by spool 16 during storage, and that can be unfolded (as shown in FIG. 2) to provide a larger surface area for panels 12 when deployed. More specifically, a portion of end 14A is fixed to spool 16 as indicated by dashed line 140. Panels 12 are arranged in a spaced apart fashion on substrate 14 such that one or more regions (e.g., two are illustrated) 142 are defined along the length of substrate 14 having no part of a panel 12 coupled thereto. Regions 142 lie within the width of spool 16 as shown. In this way, substrate 14 can be folded along regions 142 so that the folded assembly of panels 12/substrate 14 define a width that fits on spool 16. The number of regions 142 used for folding substrate 14 is not a limitation of the present invention.

With substrate 14 in its unfolded/deployed state shown in FIG. 2, a plurality of stiffening members 144 can be coupled to substrate 14 for support thereof. Stiffening members 144 adjacent container 10 can be coupled thereto as indicated at 146. The choice of stiffening members 144, means for attaching/coupling them to substrate 14 and container 10, and the number of stiffening members used are not limitations of the present invention.

Figure 3:
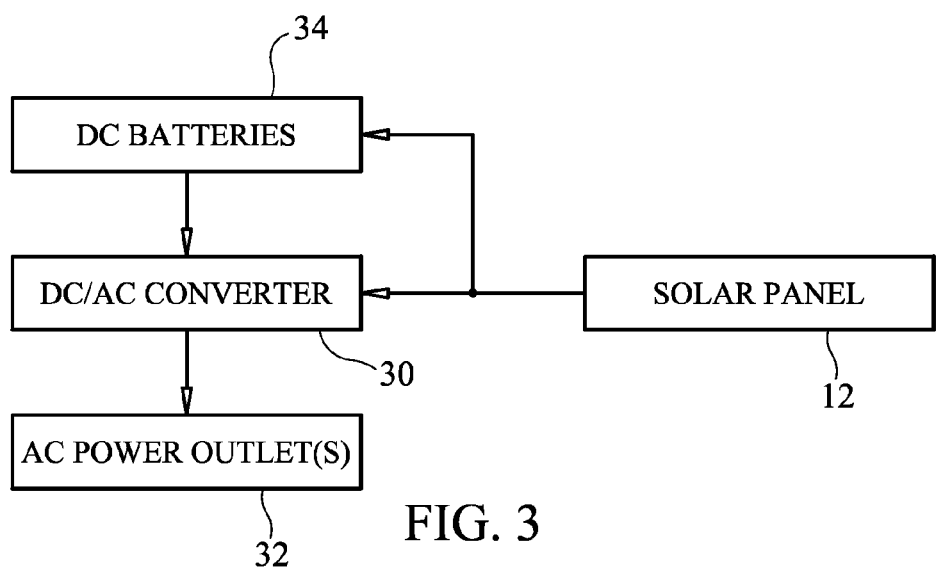
FIG. 3 is a schematic view of an electrical system that can be used to convert DC power from the solar panels to AC power in accordance with an embodiment of the present invention.

In addition to the mechanical storage and deployment features provided by the present invention, an electrical system can be provided to cooperate with solar panels 12 so that the present invention is a self-contained power provider. FIG. 3 presents a schematic view of an embodiment of a simple electrical system coupled to panels 12. Since panels 12 typically generate DC power, an DC/AC converter 30 converts the panels' DC power to AC power. One or more AC power outlets 32 can be coupled to converter 30. One or more batteries 34 could also be provided between panels 12 and converter 30 to store the panel-generated DC power until it is needed by appliances or other systems (not shown) coupled to AC power outlets 32. The electrical system can include different and/or additional elements as would be understood by one of ordinary skill in the art. The electrical system can be housed within container 10.

Figure 4:
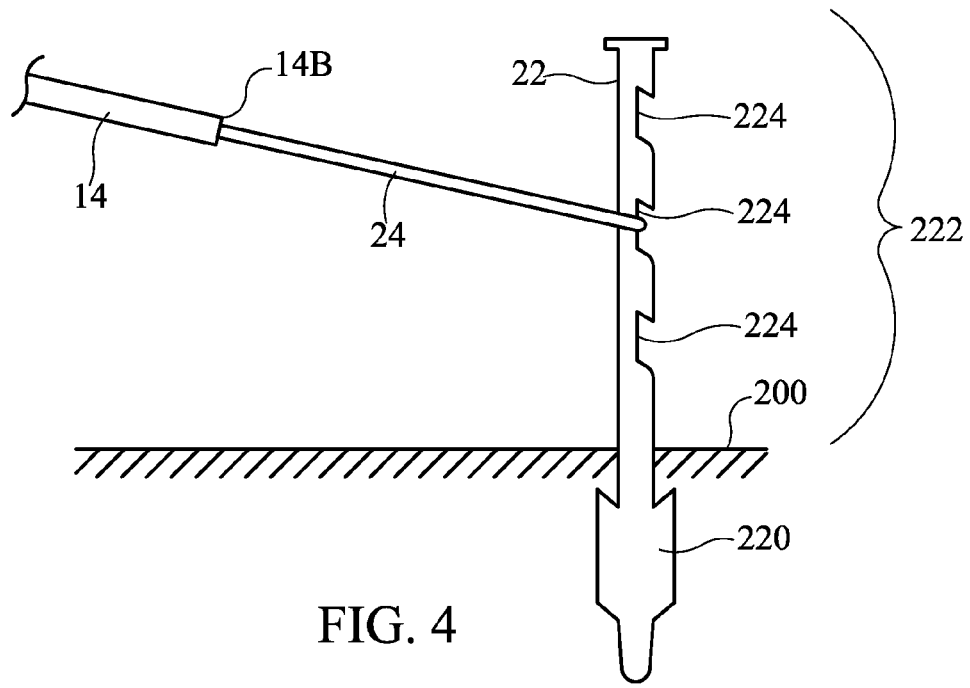
FIG. 4 is an isolated side view of the free end of the solar panel assembly coupled to a stake by a tension member in accordance with an embodiment of the present invention.

As mentioned above, stake 22 and link 24 cooperate to tension and angularly orient the assembly of panels 12 and substrate 14. An example of a stake 22 and link 24 is illustrated in FIG. 4. Stake 22 includes an anchoring end 220 designed to be readily driven into the ground at location site 200. The particular design of end 220 is not a limitation of the present invention. The exposed portion 222 of stake 22 defines a number of attachment points 224 along its length/height. For example, attachment points 224 could be notches formed in stake 22. Link 24 could be a tension member (e.g., elastic band, bungee cord, ratchet strap, etc.) coupled to end 14B of substrate 14 and to one of attachment points 224. The choice of attachment point 224 will determine the angular orientation of substrate 14 and, therefore, the angular orientation of panels 12 coupled thereto.

Figure 5:
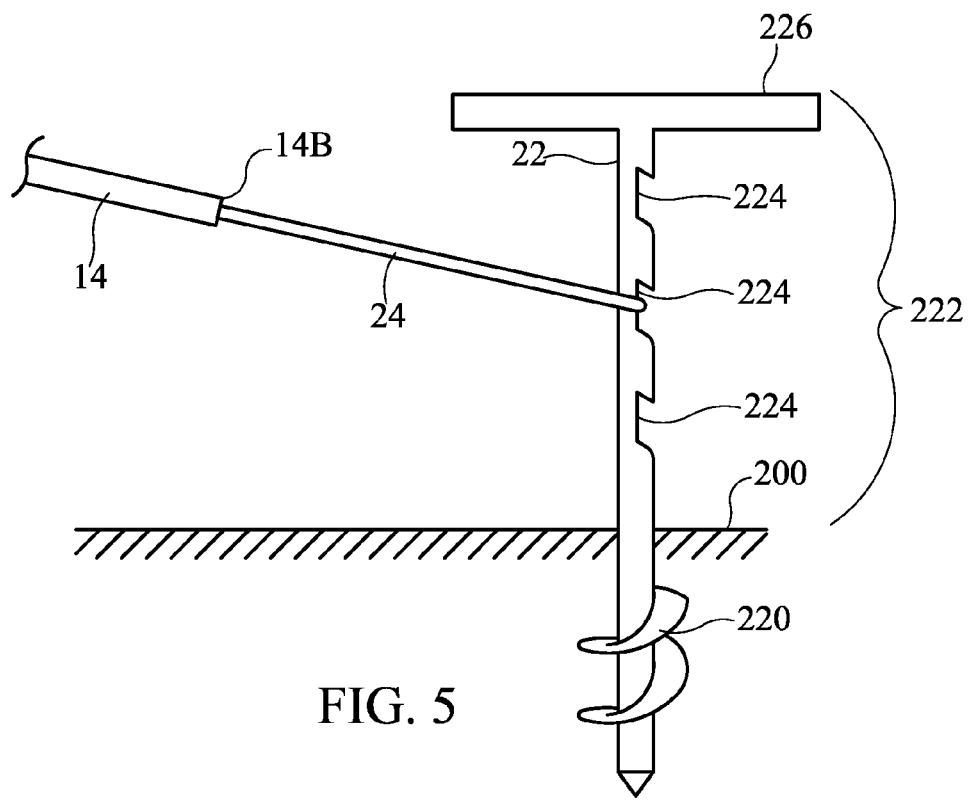
FIG. 5 is an isolated side view of a stake in accordance with another embodiment of the present invention.

FIG. 5 illustrates another type of stake 22 having a screw-shaped anchoring end 220 and a T-handle 226 formed at the top of stake 22. This type of stake can be screwed into the ground at location site 200 without the use of any tools.

The advantages of the present invention are numerous. Solar arrays are safely and securely stored for shipping, but readily deployed once on site. A simple angular orientation system allows the orientation of the panels to be easily adjusted for optimum capture of solar energy. By using a flexible solar panel assembly, the storage width of the assembly is readily reduced (i.e., folded) for winding on a storage spool. An onboard electrical system can be added to make the entire system a self-contained AC power source.

Although the invention has been described relative to specific embodiments thereof, there are numerous variations and modifications that will be readily apparent to those skilled in the art in light of the above teachings. It is therefore to be understood that, within the scope of the appended claims, the invention may be practiced other than as specifically described.

What is claimed as new and desired to be secured by Letters Patent of the United States is:

1. A solar panel storage and deployment system, comprising:
   a container having an opening formed therein;
   a rotatable spool mounted in said container, said spool defining a spool width;
   a flexible substrate having a width greater than said spool width, said flexible substrate further having a length, said flexible substrate having a portion of a first end thereof along said width fixed to said spool, said flexible substrate having a free end opposing said first end;
   an array of solar voltaic panels coupled to said flexible substrate in a spaced apart fashion wherein at least one continuous linear region defined along said length of said flexible substrate has none of said panels coupled thereto and wherein said flexible substrate with said panels coupled thereto and folded along each said region have a combined width that is less than said spool width for winding on said spool;
   a plurality of stakes adapted to be anchored to positions in proximity to and outside of said container; and
   a corresponding plurality of links for coupling said free end of said flexible substrate to said stakes for lacing said flexible substrate in tension when said flexible substrate with said panels coupled thereto is unwound from said spool, deployed through said opening, and unfolded along each said region.

2. A system as in claim 1, wherein said panels generate DC power when so-deployed and exposed to solar energy, said system further comprising an electrical system electrically coupled to said panels for converting said DC power generated by said panels to AC power.

3. A system as in claim 2, further comprising at least one DC power storage element electrically coupled to said electrical system for storing said DC power.

4. A system as in claim 1, further comprising a motor for rotating said spool.

5. A system as in claim 1, wherein said flexible substrate comprises a tensile fabric.

6. A system as in claim 1, wherein each of said stakes defines a plurality of attachment points for cooperation with one of said links, each of said attachment points being at a unique location on each of said stakes.

7. A system as in claim 1, wherein each of said links is adjustable in length.

8. A system as in claim 1, further comprising a plurality of stiffening members coupled to said flexible substrate so-unfolded along each said region.

\* \* \* \* \*